(12) United States Patent
Balasubramanian et al.

(10) Patent No.: US 6,846,720 B2
(45) Date of Patent: Jan. 25, 2005

(54) METHOD TO REDUCE JUNCTION LEAKAGE CURRENT IN STRAINED SILICON ON SILICON-GERMANIUM DEVICES

(75) Inventors: Narayanan Balasubramanian, Singapore (SG); Richard Hammond, Stoke-on-Trent (GB)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/464,282

(22) Filed: Jun. 18, 2003

(65) Prior Publication Data

US 2004/0259314 A1 Dec. 23, 2004

(51) Int. Cl.⁷ .................. H01L 21/76; H01L 21/336
(52) U.S. Cl. .................. 438/424; 438/296; 438/425
(58) Field of Search .................. 438/424, 296, 438/425, 427, 301, 413, 435

(56) References Cited

U.S. PATENT DOCUMENTS

| | | | |
|---|---|---|---|
| 6,191,432 B1 * | 2/2001 | Sugiyama et al. ............. 257/19 |
| 6,235,567 B1 | 5/2001 | Huang ........................ 438/202 |
| 6,274,894 B1 | 8/2001 | Wieczorek et al. ......... 257/192 |
| 6,294,817 B1 | 9/2001 | Srinivasan et al. ......... 257/397 |
| 6,306,723 B1 | 10/2001 | Chen et al. ................. 438/429 |
| 6,362,071 B1 * | 3/2002 | Nguyen et al. ............. 438/416 |
| 6,492,216 B1 * | 12/2002 | Yeo et al. .................... 438/197 |
| 6,515,335 B1 * | 2/2003 | Christiansen et al. ....... 257/347 |
| 6,583,000 B1 * | 6/2003 | Hsu et al. .................... 438/222 |
| 6,593,191 B2 * | 7/2003 | Fitzgerald ................... 438/282 |
| 6,593,641 B1 * | 7/2003 | Fitzgerald ................... 257/616 |
| 6,642,536 B1 * | 11/2003 | Xiang et al. ................. 257/19 |
| 6,646,322 B2 * | 11/2003 | Fitzgerald ................... 257/531 |
| 6,670,682 B1 * | 12/2003 | Mouli ........................ 257/385 |
| 6,696,348 B1 * | 2/2004 | Xiang ........................ 438/424 |

OTHER PUBLICATIONS

J.G. Spooner, *IBM reveals new strain of chip power*, CNET News.com, Jun. 8, 2001.

* cited by examiner

Primary Examiner—John F. Niebling
Assistant Examiner—Walter L. Lindsay, Jr.
(74) Attorney, Agent, or Firm—George O. Saile; Stephen B. Ackerman

(57) ABSTRACT

A MOSFET device in strained silicon-on-SiGe and a method of forming the device are described. The said device achieves reduced junction leakage due to the lower band-gap values of SiGe. The method consists of forming isolation trenches in a composite strained-Si/SiGe substrate and growing a liner oxide by wet oxidation such that oxidation is selective to SiGe only, with negligible oxidation of silicon surfaces. Selective oxidation results in oxide encroachment under strained-Si, thereby reducing the junction area after device fabrication is completed. Reduced junction area leads to reduced $n^+/p$ or $p^+/n$ junction leakage current.

19 Claims, 4 Drawing Sheets

METHOD TO REDUCE JUNCTION LEAKAGE CURRENT IN STRAINED SILICON ON SILICON-GERMANIUM DEVICES

BACKGROUND OF THE INVENTION (1) Field of the Invention

The present invention relates generally to a silicon on silicon-germanium (SiGe) device and particularly to a method for reducing junction leakage current in an MOS device formed in strained silicon on SiGe.

(2) Description of the Prior Art

Continuous demand for improved performance in the electronics industry has been possible as a result of materials, equipment, and process advances related to silicon technology. However, economic and physical constraints are rendering further developments to conventional silicon technology unviable. To date, the performance of a semiconductor device has improved its performance by miniaturizing the dimensions and by increasing scale of integration. There has been therefore, in the last five years, a lot of discussion in trade journals on a new technology, strained-silicon transistors, that has potential use in the next CMOS (complimentary CMOS) generations. The strained-silicon (SS) transistor is fabricated on a silicon layer deposited on a substrate containing SiGe and utilizing the resulting lattice distortion in deposited silicon to achieve higher carrier mobility. With up to 4.2% lattice mismatch between relaxed Si and SiGe, silicon lattice when epitaxially deposited on relaxed SiGe gets stretched resulting in strained silicon. Electrons and holes in such strained silicon have a higher mobility than those in conventional unstrained silicon. If a transistor is fabricated using strained layer as the channel layer in a MOSFET device, the speed of the device is significantly increased. Up to 70% increase in electron mobility and 35% improvement in chip performance have been reported (J. G. Spooner, *IBM reveals new strain of chip power*, CNET News.com, Jun. 8, 2001).

SS technology is aimed at applications such as high performance electronics, both digital and analog; wireless ICs; high-end microprocessors used in servers; handheld devices requiring lower power consumption. The SS technology is not without its challenges, being quite new to the business. Some major ones are: dislocations in SS, maintaining the strain level through all the process steps in manufacturing, degradation of interface strain. In addition, the challenges faced by bulk silicon such as short channel effects, device isolation, CMOS integration issues are also applicable to strained silicon. The SS transistor technology being new, it does not have much prior art on fabrication processes described in the literature. The patents discussed in the following paragraphs pertain more to some process steps that are used in the conventional silicon transistor fabrication technology and are used in fabricating SS transistors and SiGe devices.

U.S. Pat. No. 6,235,567 B1 describes a process for forming SiGe, BiCMOS (bipolar CMOS) device on SOI (silicon-on-insulator). CMOS transistors are formed in a 0.1–0.2 $\mu$m thick silicon layer deposited on an SOI substrate. Bipolar SiGe transistors are formed in a nominally 0.5 $\mu$m thick epitaxial film. CMOS transistors are formed first and then covered with an insulating film. The insulating film is removed from the bipolar areas and an epitaxial SiGe layer is deposited on exposed silicon. Bipolar transistors are then formed in the epitaxial layer for the base and having an encapsulated structure for device insulation using shallow isolation trenches and the buried oxide.

U.S. Pat. No. 6,274,894 B1 describes a short-channel MOS transistor and a method of forming a low-band gap source and drain in such a device. A gate structure formed on a semiconductor substrate is covered on all sides with a dielectric layer. Shallow trenches are then etched on either side of the gate. A thin layer of a material, with band-gap lower than that of the substrate, is grown on the exposed semiconductor surfaces of the trench using selective epitaxial deposition. The lower band-gap material may be un-doped to be used as a buffer layer for inter-diffusion of dopants between source and drain regions; or it may be heavily doped with the same carrier type as the substrate and used as a halo region to reduce punch-through and threshold voltage lowering effects. The portion of the trench above the low-band gap layer is filled with semiconductor material doped with opposite carrier type than that of the substrate to form lightly doped drain regions of the source and drain.

U.S. Pat. No. 6,294,817 B1 describes a source/drain—on—insulator (S/DOI) FET and a method of fabrication using oxidized amorphous silicon. Shallow trench isolation partially surrounds each transistor. Typically for a single transistor, only one surface of each source and drain (S/D) region make direct contact to the semiconductor body; and these surfaces are on opposite side of the channel region of each transistor. One method of fabrication of forming S/D regions is to form an isolation structure around active areas in which transistor is to be formed. Trenches separated by portions of the body are then formed in the active areas. On the bottom surface of the trench, an insulating layer is deposited and then filled with a semiconductor material of a conductivity type opposite that of the semiconductor substrate. The semiconductor filled portion of each trench serves as a drain and/or source of an FET.

U.S. Pat. No. 6,306,723 B1 describes a method to form shallow trench isolations without chemical mechanical polishing. After depositing a pad oxide layer and a silicon nitride layer on a silicon substrate, trenches are formed into the silicon substrate to form shallow trench isolation. A liner oxide is then grown in the trenches followed by spacer oxide deposition over the silicon nitride layer and the liner oxide layer to partially fill the trenches. The spacer and liner oxide layers are anisotropically etched to form side-wall spacers within the trenches while exposing the bottom silicon surfaces. A silicon layer is then selectively grown on the exposed silicon surface to partially fill the trenches. A trench oxide layer is then formed over the silicon layer. The silicon nitride and pad oxide layers are then removed to complete shallow trench isolation formation.

It is to be noted here that none of these patents describes MOSFET device fabrication in strained-silicon on SiGe substrate. One limitation of a device featuring a p-n junction on strained Si/SiGe substrate is the higher junction leakage current compared to bulk Si, associated with the lower band gap of SiGe. As MOSFET features p-n junction in the form of source-to-substrate and drain-to-substrate, the leakage current problem can be dominant during reverse biasing of the drain junction.

SUMMARY OF THE INVENTION

Accordingly, it is a primary object of the invention to describe a method to form p-n junction structures in strained-silicon on SiGe substrate.

It is yet another object to describe a method to form a transistor in strained-silicon on a SiGe substrate with reduced junction leakage current.

Still another object is to describe an MOS device formed in strained-silicon on a SiGe substrate.

In accordance with these objectives, a method is described to fabricate an MOSFET device in strained-silicon on SiGe layer which is deposited on a silicon substrate. Shallow isolation trenches are first formed in the strained-silicon/SiGe stack. Next, wet oxidation is done at 700° C. so that SiGe is oxidized selectively with respect to strained or bulk silicon to form a liner oxide on the shallow trench surfaces. An encroachment of about 0.2 μm is achieved under these conditions at the interface between source/drain and shallow trench. The trenches are then filled with CVD oxide, chemically mechanically polished, and the oxide/nitride mask stripped. The MOS transistor is then fabricated using standard steps of gate oxidation of the strained-silicon, poly-silicon gate deposition, patterning the gate, ion implanting/annealing the source/drain regions and the poly-silicon gate. Because of encroachment achieved during wet oxidation, the junction area is reduced because of which the $n^+/p$ junction leakage is correspondingly reduced.

BRIEF DESCRIPTION OF THE DRAWINGS

The invention is described using the figures shown. The figures are schematic representation of the process steps and the device fabricated using said process steps.

DESCRIPTION OF THE PREFERRED EMBODIMENTS

Figure 1:
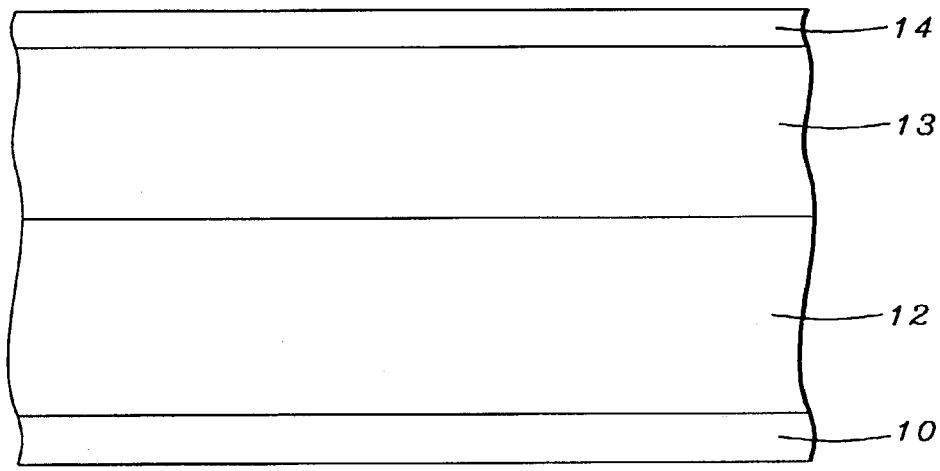
FIG. 1 is a cross-sectional view of the composite substrate with strained-silicon, SiGe layers, and substrate silicon.

Strained-silicon MOSFETs are formed on a composite substrate, shown in FIG. 1, consisting of a bulk silicon substrate 10, graded composition silicon germanium buffer layer 12, uniform composition SiGe buffer layer 13, and a thin layer of strained silicon layer 14 heteroepitaxially deposited over SiGe layer. The deposition processes known in prior art are used for depositing said SiGe and thin Si layers. Said graded composition SiGe buffer layer, p-type in one embodiment, is approximately about 1 μm–4 μm thick, uniform composition buffer SiGe layer 13 is approximately about 0.5 μm–2 μm thick, and said top silicon layer 14 is approximately 50–400°A thick. In the graded SiGe buffer layer, Ge composition is graded in that there is a higher concentration of Germanium (Ge) atoms near the top. Maximum germanium concentration in the graded layer can vary from 0–40%. Said uniform composition SiGe buffer layer (composition is the same as the maximum value of the graded layer) being thicker, lattice mismatch between SiGe layer 13 and the thin silicon layer 14 places the strain on silicon, stretching the silicon atoms in the lattice by about 2% in lateral vertical planes. The stretching out of atoms takes place because of the natural tendency of atoms to align with one another. A large impact on carrier mobility for both electrons and holes (70% higher as compared to conventional silicon) due to larger atom—atom spacing in strained silicon layer is achievable. The bulk silicon substrate used in this embodiment is p-type silicon for fabricating an n-channel device. Alternatively, n-type silicon (or n-well in p-type silicon) is used for forming a p-channel device.

Figure 2:
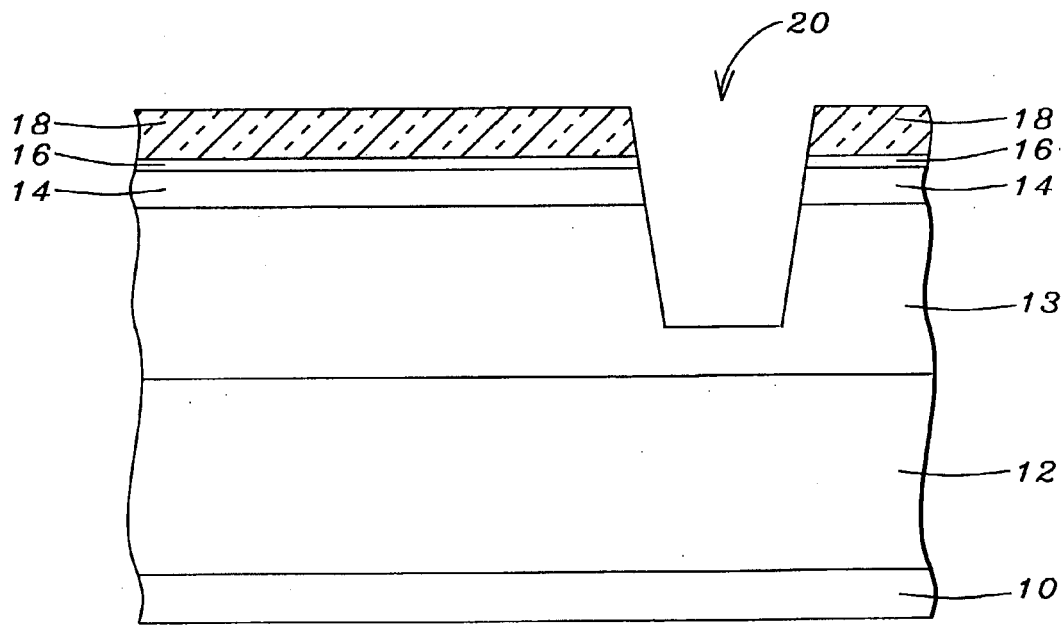
FIG. 2 is a cross-sectional view of the substrate after forming shallow trench pattern.

The pad oxide layer 16, silicon nitride hard mask layer 18 are then deposited using oxidation and chemical vapor deposition methods known in prior art. Shallow trench mask pattern (not shown in the figure) is then formed in resist using lithographic methods known in prior art. Trench pattern is first transferred into silicon nitride layer 18 and the resist mask is stripped off. Using silicon nitride pattern as hard mask, shallow trench 20 is then etched anisotropically through said oxide layer, top silicon layer, and SiGe layer using reactive ion etching process known in prior art. Shallow trench structure after resist strip is shown in FIG. 2.

Figure 3:
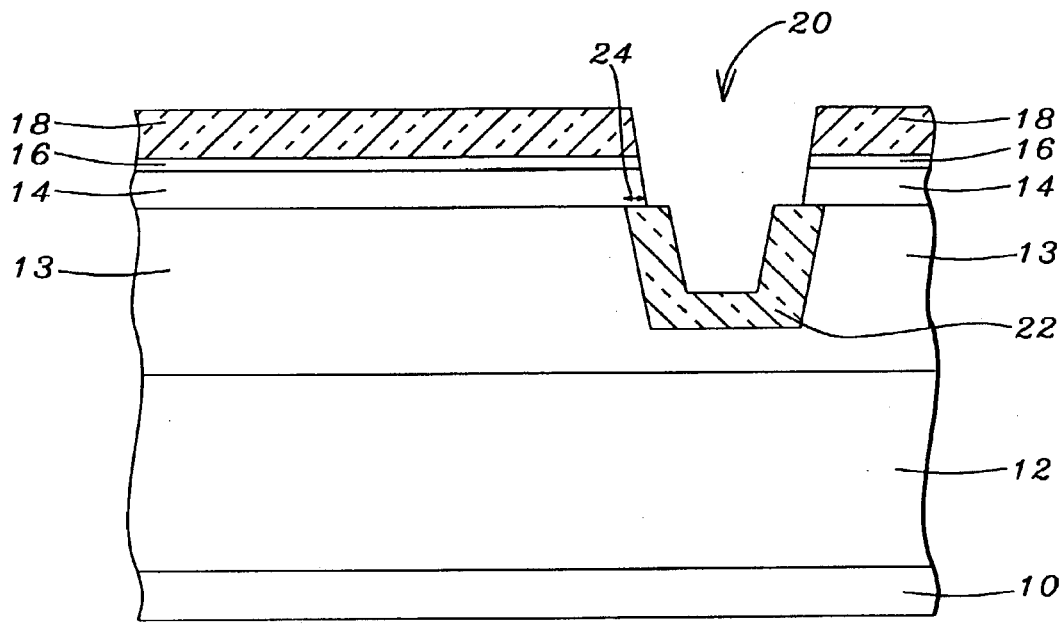
FIG. 3 is a cross-sectional view of the shallow trench after wet oxidation of the substrate, showing encroachment.

The wafer is then subjected to selective wet oxidation at approximately about 600–700° C. in a furnace. Under said conditions of oxidation, the oxide grows selectively only on SiGe and insignificantly little on strained or bulk silicon. Experimental results show the oxidation selectivity on SiGe:Si to be approximately 100:1. Duration of oxidation depends on the thickness of liner oxide 22 and degree of encroachment desired. Since there is almost no oxide growth on strained silicon surface, there results an encroachment of oxide, approximately between 0.1 μm and 0.4 μm, from SiGe under the strained-Si layer as shown by the arrow. The encroachment structure, which is unique to this invention, is critical since this reduces the effective junction area and thereby reduces $n^+/p$ junction leakage current between the drain and the substrate. Shallow trench after liner oxidation, showing oxide encroachment 24, is shown in FIG. 3.

Figure 4:
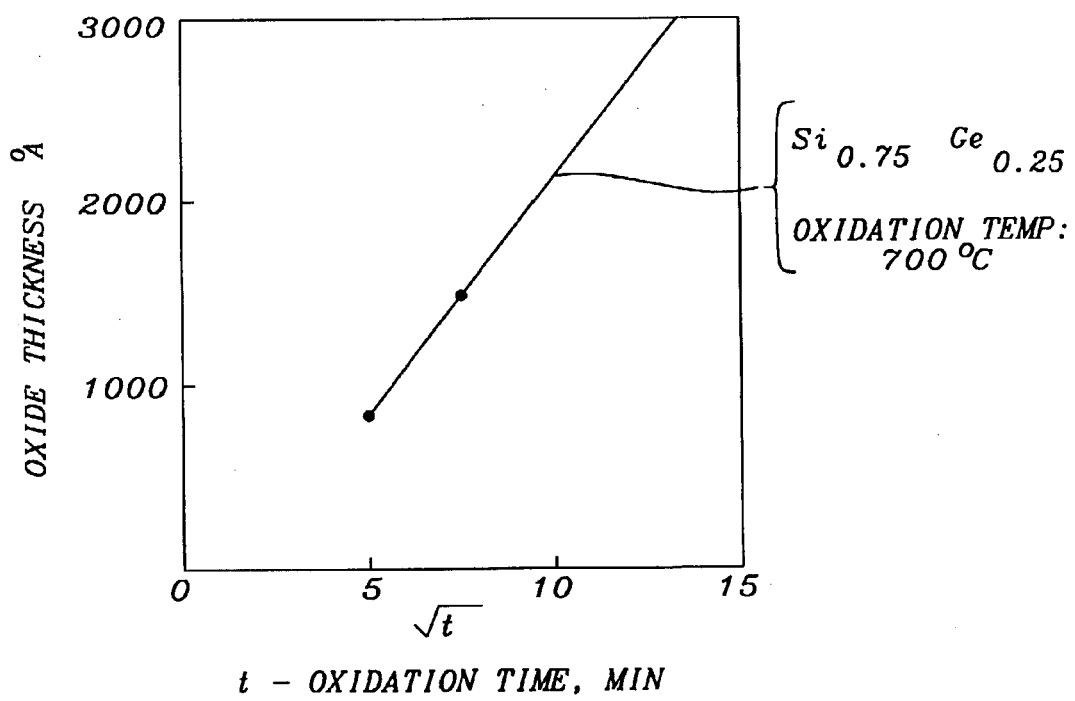
FIG. 4 is a graph showing oxide thickness of $Si_{0.75}Ge_{0.25}$ as a function of oxidation time.

Oxide thickness as a function of square root of the wet oxidation time for $Si_{0.75} Ge_{0.25}$ at 700° C. is shown in FIG. 4.

Figure 5:
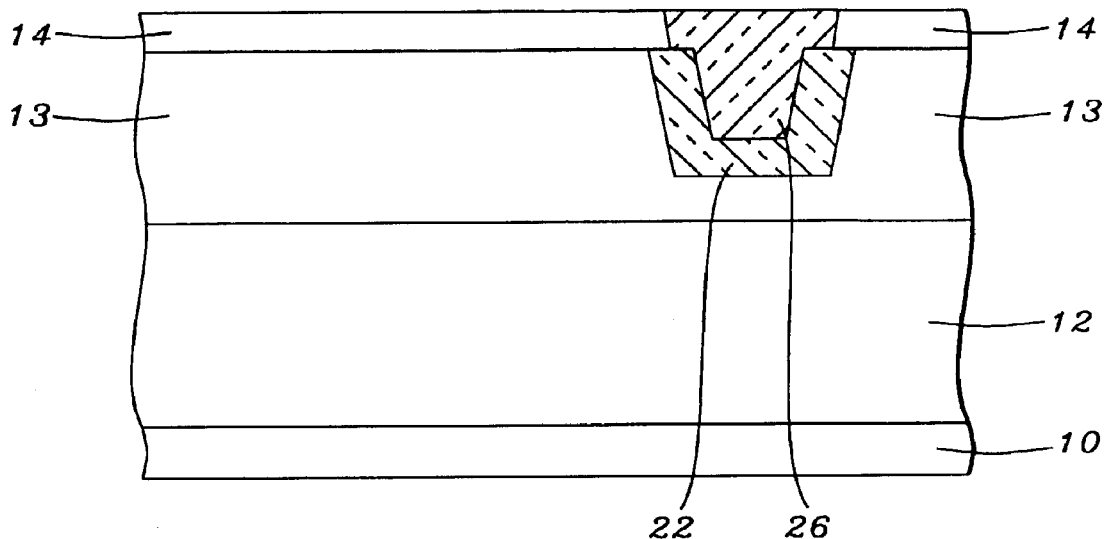
FIG. 5 is a cross-sectional view of the shallow trench after trench fill, CMP planarization, and stripping the hard mask.

The trench is then filled with CVD silicon dioxide 26, densified by high temperature annealing, planarized by a method than includes chemical mechanical polishing, and the hard mask layers (e.g. silicon nitride and pad oxide) wet stripped, all processes being known in prior art. The resulting structure with shallow isolation trench 20 with silicon dioxide 26 is shown in FIG. 5. Both 22 and 26 are silicon dioxide.

Figure 6:
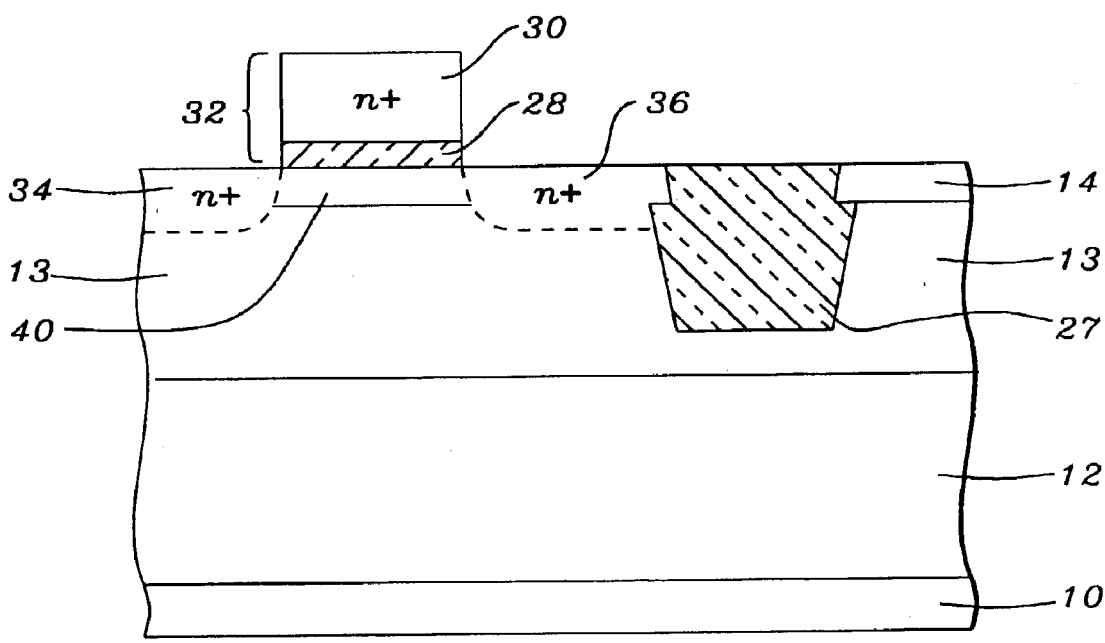
FIG. 6 is a cross-sectional view of the partially formed device after forming the gate structure and the source/drain regions.

Gate oxide 28, poly-silicon gate 30 are then deposited to form the gate structure 32. After doping with appropriate dopants, arsenic in this embodiment, the structure of FIG. 6 is formed with source 34, drain 36, doped poly silicon gate 30, and channel region 40. Isolation oxide is now shown as 27. Processes for forming the gate and source/drain are those known in prior art.

Figure 7:
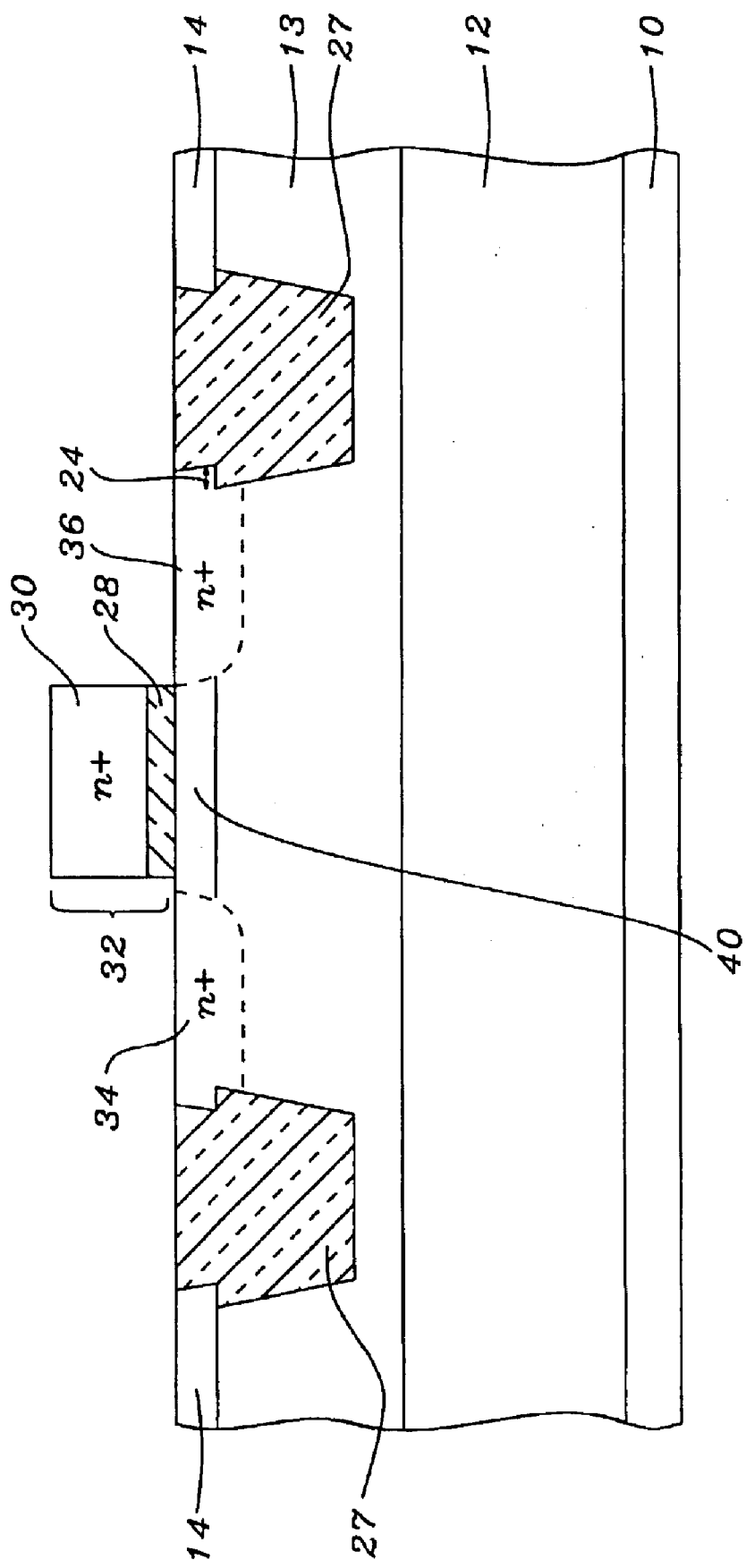
FIG. 7 is a cross-sectional view of the completed MOS device formed in strained-silicon/SiGe substrate, showing reduced junction area in the drain/isolation trench region.

FIG. 7 shows the final MOS device 38 with isolation regions 27. Also shown is the reduction in junction area 36 due to oxide encroachment 24. It is to be noted that the channel region 40 between source and drain of the device is in the strained-silicon; this results in higher electron mobility and improved device performance as a consequence.

Although the process is described for fabricating an n-channel FET device, the invention process can be used to fabricate other type devices such as CMOS and p-channel FET.

The advantages of the present invention over prior art are:

Minimizes diode junction leakage current, associated with the lower band gap of SiGe, in these class of strained-silicon/SiGe devices.

Selective oxidation of SiGe with respect to silicon provides controlled encroachment of oxide to reduce junction area and thereby leakage current.

Reduced junction area being a geometric effect, improvements in the reduction of leakage current will be more pronounced in the next generation devices with even smaller design rules.

While the invention has been particularly shown with reference to the preferred embodiment thereof, it will be understood by those skilled in the art that various changes may be made in its form and details without departing from the spirit and scope of this invention.

What is claimed is:

1. A method of forming a strained silicon-on-SiGe device; the method comprising:
   forming a multiple layered silicon-germanium (SiGe) film on a semiconductor substrate;
   forming a silicon layer on said multiple layered silicon-germanium film to form strained-silicon;
   forming a shallow trench in said strained-silicon and multiple layered SiGe layers;
   forming an oxide liner on said shallow trench surfaces by thermal oxidation;
   filling and planarizing said shallow trench in said strained-silicon/multiple layered SiGe;
   forming a gate structure over said strained silicon-on-SiGe layer; and
   forming doped source and drain regions in said strained silicon-on-SiGe layer.

2. The method of forming a strained silicon-on-SiGe device according to claim 1, wherein said SiGe layer is composed of two or more layers: graded composition and uniform composition layers.

3. The method of forming a strained silicon-on-SiGe device according to claim 2, wherein thickness of said graded composition SiGe layer is approximately between 1 $\mu$m–4 $\mu$m.

4. The method of forming a strained silicon-on-SiGe device according to claim 2, wherein said graded SiGe layer has a composition of approximately between 0 and 40% Ge.

5. The method of forming a strained silicon-on-SiGe device according to claim 2, wherein the thickness of said uniform composition SiGe layer is approximately between 0.5 and 2 $\mu$m thick.

6. The method of forming a strained silicon-on-SiGe device according to claim 1, wherein said silicon layer thickness over SiGe layer is approximately between 50 Å and 400 Å.

7. The method of forming a strained silicon-on-SiGe device according to claim 1, wherein said silicon dioxide liner is formed using wet oxidation at approximately between 600° C. and 700° C.

8. The method of forming a strained silicon-on-SiGe device according to claim 7, wherein said wet oxidation is selective to SiGe layer.

9. The method of forming a strained silicon-on-SiGe device according to claim 7, wherein said oxidation selectivity between SiGe and silicon is approximately 100:1.

10. The method of forming a strained silicon-on-SiGe device according to claim 7, wherein said wet oxidation produces oxide encroachment of approximately between 0.1 $\mu$m and 0.4 $\mu$m under strained-silicon layer.

11. The method of forming a strained silicon-on-SiGe MOSFET device with reduced leakage current; the method comprising:
    forming graded and uniform composition silicon-germanium (SiGe) buffer layers on a silicon substrate,
    forming a silicon layer on said uniform SiGe layer to form strained-silicon;
    forming a shallow trench in said strained-silicon and SiGe layers;
    forming an oxide liner on said shallow trench surfaces; and
    forming the completed MOSFET device on said strained silicon-on-SiGe layer.

12. The method of forming a strained silicon-on-SiGe MOSFET device according to claim 11, wherein thickness of said graded composition SiGe buffer layer is approximately between 1 $\mu$m and 4 $\mu$m.

13. The method of forming a strained silicon-on-SiGe device according to claim 12, wherein said graded SiGe layer has a composition from 0 to 40% Ge.

14. The method of forming a strained silicon-on-SiGe device according to claim 11, wherein thickness of said uniform composition SiGe buffer layer is approximately between 0.5 and 2 $\mu$m.

15. The method of forming a strained silicon—on—SiGe device according to claim 11, wherein said silicon layer thickness over uniform composition SiGe layer is approximately between 50 Å and 400 Å.

16. The method of forming a strained silicon-on-SiGe device according to claim 11, wherein said silicon dioxide liner is formed using wet oxidation at approximately between 600 and 700° C.

17. The method of forming a strained silicon-on-SiGe device according to claim 16, wherein said wet oxidation is selective to SiGe layer.

18. The method of forming a strained silicon-on-SiGe device according to claim 16, wherein said oxidation selectivity between SiGe and silicon is approximately 100:1.

19. The method of forming a strained silicon-on-SiGe device according to claim 16, wherein said wet oxidation produces oxide encroachment of approximately between 0.2 $\mu$m and 0.4 $\mu$m under strained-silicon layer.

* * * * *